United States Patent [19]
Blonder et al.

[11] Patent Number: 5,101,454
[45] Date of Patent: Mar. 31, 1992

[54] LIGHT EMITTING DIODE WITH MULTIFACETED REFLECTOR TO INCREASE COUPLING EFFICIENCY AND ALIGNMENT TOLERANCE

[75] Inventors: Greg E. Blonder, Summit; Robert S. Freund, Livingston; Roderick K. Watts, Summit; Robert C. Wetzel, Passaic, all of N.J.

[73] Assignee: AT&T Bell Laboratories, Murray Hill, N.J.

[21] Appl. No.: 658,144

[22] Filed: Feb. 20, 1991

[51] Int. Cl.$^5$ .......................... G02B 6/32; G02B 6/10; H01S 3/19; H01J 5/16
[52] U.S. Cl. ..................................... 385/14; 385/33; 385/131; 372/50; 250/227.11
[58] Field of Search ............... 350/96.11, 96.12, 96.13, 350/96.14, 96.15, 96.18, 96.20; 250/227.11; 372/44, 45, 46, 50; 369/44.12; 385/14, 33, 37, 130, 131, 88, 93

[56] References Cited

U.S. PATENT DOCUMENTS

| | | | |
|---|---|---|---|
| 4,367,916 | 1/1983 | Mottier et al. | 350/96.12 X |
| 4,440,468 | 4/1984 | Auracher et al. | 350/96.12 |
| 4,815,084 | 3/1989 | Scifres et al. | 372/46 |
| 4,935,939 | 6/1990 | Liau et al. | 350/96.15 X |
| 4,983,499 | 1/1991 | Suzuki et al. | 350/96.12 X |
| 5,040,868 | 8/1991 | Waitl et al. | 385/14 X |

FOREIGN PATENT DOCUMENTS 61-162010 7/1986 Japan ........................... 350/96.11 X
9000135 8/1990 Netherlands ................. 369/44.12 X

OTHER PUBLICATIONS

A. R. Franklin and R. Newman, "Shaped Electroluminescent GaAs Diodes", Journal of Applied Physics, vol. 35, No. 4, Apr. 1964, pp. 1153-1155.
S. V. Galginaitis "Improving the External Efficiency of Electroluminescent Diodes", Journal of Applied Physics, vol. 36, No. 2, Feb. 1963, pp. 460-461.
W. N. Carr and G. E. Pittman, "One-Watt GaAs p-n Junction Infrared Source", Applied Physics Letters, vol. 3, No. 10, 15 Nov. 1963, pp. 173-175.

*Primary Examiner*—Brian Healy
*Attorney, Agent, or Firm*—Glen E. Books

[57] ABSTRACT

A light source, such as an LED, is provided with a multifaceted reflector to facilitate coupling of emitted light into an optical waveguide such as an optical fiber. In a preferred embodiment, a conventional LED fabricated on one side of a transparent substrate is provided with a series of integral concentric reflecting rings on the opposite side of the substrate. The rings reflect light diverging from the LED toward the central axis of an optical fiber light.

10 Claims, 4 Drawing Sheets

LIGHT EMITTING DIODE WITH MULTIFACETED REFLECTOR TO INCREASE COUPLING EFFICIENCY AND ALIGNMENT TOLERANCE

FIELD OF THE INVENTION

The present invention relates to an optical device for applying light to an optical guiding means and, in preferred form, to a light emitting diode having an integral multifaceted reflector to facilitate emission of light and coupling of the emitted light into an optical fiber.

BACKGROUND OF THE INVENTION

Light emitting diodes (LEDs) provide a reliable, less expensive alternative to laser sources in optical fiber communications systems. LEDs utilize relatively simple driving circuits without need for feedback to control power output, and they are capable of operating over a wide range of temperatures with projected device lifetime of one or two orders of magnitude longer than those of laser diodes made of the same material. InGaAsP LEDs are particularly useful for optical fiber systems. These LEDs emit light at a wavelength of about 1.3 micrometers, a wavelength at which optical fibers exhibit low attenuation and dispersion.

An important requirement for use of LED sources in optical fiber systems is efficient emission of light and coupling of the emitted light into an optical fiber. Inefficiencies in the emission of light arise because of total internal reflection of light at semiconductor/air interface of an LED. There is a relatively large difference between the index of refraction of typical LED semiconductors and that of air. As a consequence, the critical angle for light approaching a semiconductor air interface is relatively small, and light approaching the interface at an angle exceeding the critical angle will not exit the semiconductor but rather will be totally internally reflected. For example, the index of refraction of InP is approximately 3.3 as compared to 1.0 for air. As a consequence, only light approaching an InP surface at an angle within about 18° from the normal will exit the semiconductor. Light at an angle of more than 18° will be reflected back into the semiconductor.

Furthermore, even if the light exits the semiconductor, there are inefficiencies in coupling the emitted light into an optical fiber. An optical fiber is a small diameter waveguide characterized by a core with a first index of refraction surrounded by a concentric cladding with a second index of refraction. Light rays which impinge upon the core at an angle (measured from the fiber axis) which is less than a critical acceptance angle undergo total internal reflection within the fiber core. These rays are guided along the axis of the fiber with minimum attenuation. Rays at an angle exceeding the critical acceptance angle are not coupled into the fiber. Thus in a typical coupling arrangement only a small fraction of the light emitted by an LED propagates along the fiber.

One approach to increasing the emission of light is to "sculpt" the region of the semiconductor above the LED active region into a spherical shape and thus reduce the angle of incidence for light from the active region. Subtle adjustment of the spherical shape can also provide a focussing effect which increases coupling of emitted light into an adjacent optical fiber. While this approach provides an increase in efficiency, the extent to which the surface can be sculpted is limited because the etching techniques used to perform the sculpting cannot readily configure with the necessary precision to a depth in excess of about 10 micrometers. Thus the extent of the sculpted region is limited.

SUMMARY OF THE INVENTION

In accordance with the invention, a light source, such as an LED, is provided with a multifaceted reflector to facilitate coupling of emitted light into an optical waveguide such as an optical fiber. In a preferred embodiment, a conventional LED fabricated on one side of a transparent substrate is provided with a series of integral concentric reflecting rings on the opposite side of the substrate. The rings reflect light diverging from the LED toward the central axis of an optical fiber.

BRIEF DESCRIPTION OF THE DRAWING

The advantages, nature and various additional features of the invention will appear more fully upon consideration of the illustrative embodiments now to be described in detail in connection with the accompanying drawings. In the drawings.

While the preferred method for forming the reflector structure described here is that set forth in the concurrently filed application of G. E. Blonder entitled Method for Etching a Sloped Surface Having a Predetermined Slope, it should be recognized that there are a variety of other techniques known in the art which could be used to sculpt the semiconductor surface into the reflector arrangement of the inventor.

Figure 3:
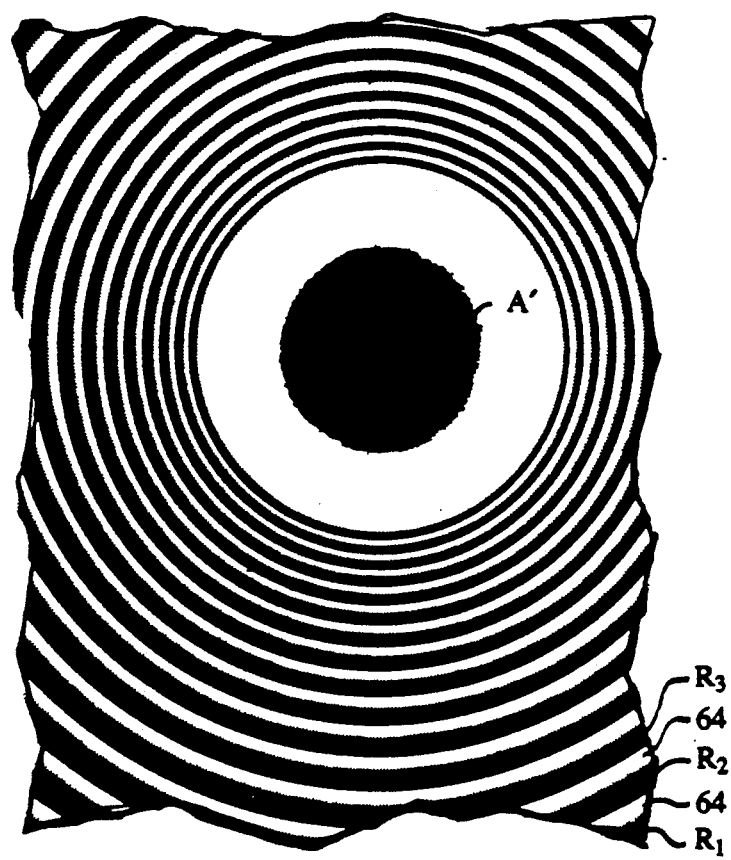
FIGS. 3 and 4 are photographic illustrations of a photolithographic mask used in fabricating an LED of the type shown in FIGS. 1 and 2.
Figure 4:
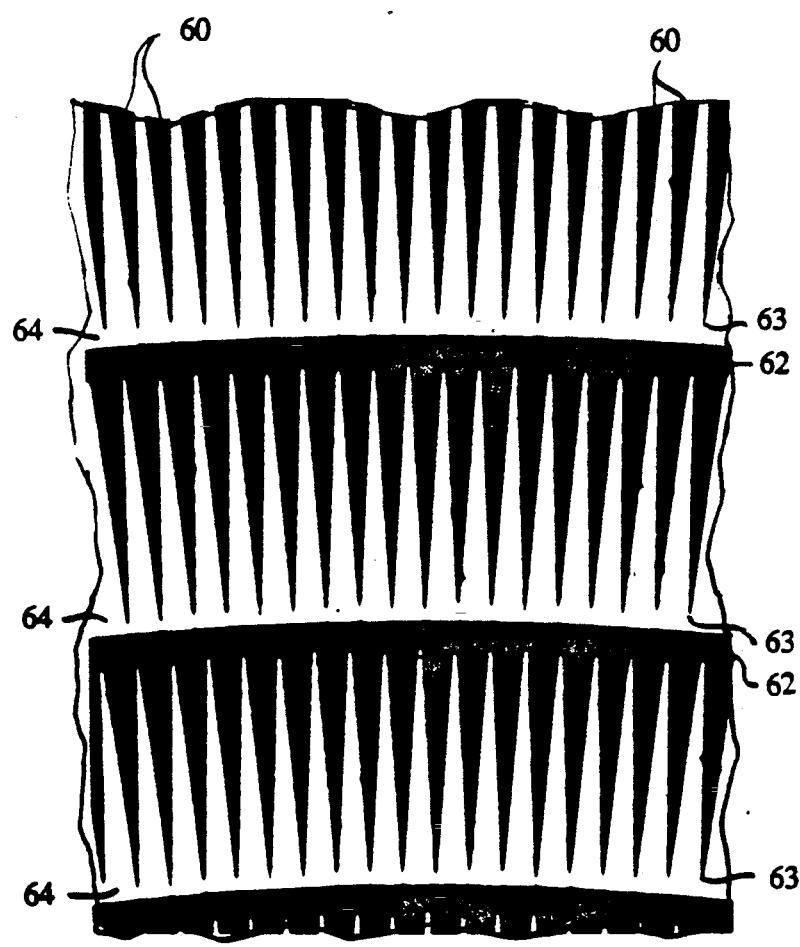

It is to be understood that these drawings are for purposes of illustrating the concepts of the invention and, except for FIGS. 3 and 4, are not to scale.

DETAILED DESCRIPTION

Figure 1:
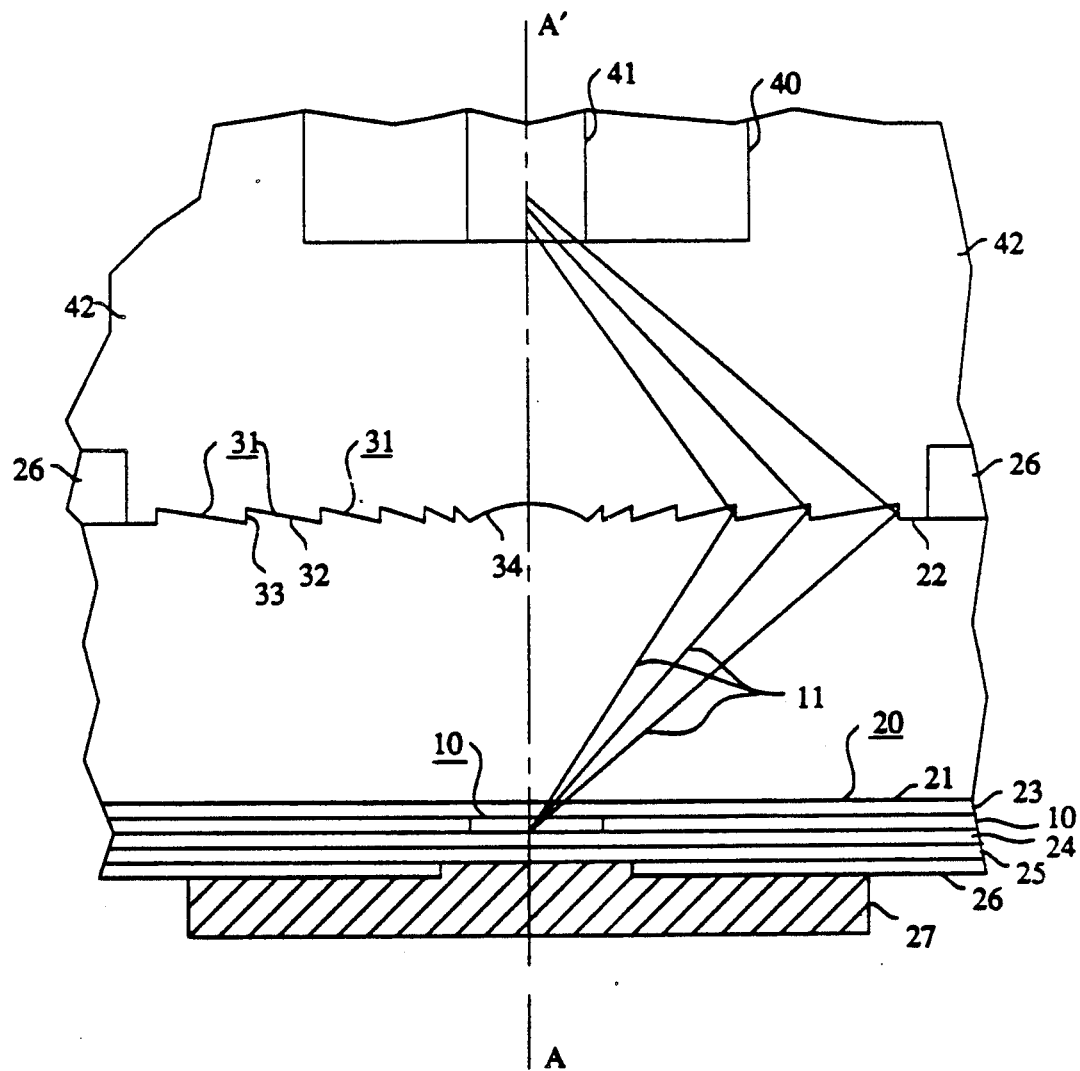
FIG. 1 is a schematic cross section of an LED having a multifaceted reflector in accordance with the invention.

Referring to the drawings, FIG. 1 illustrates in schematic cross section an LED in accordance with a preferred embodiment of the invention. In essence the LED comprises a conventional LED active region 10 formed adjacent one surface 21 of a transparent substrate 20 and, on an opposing surface 22, a multifaceted reflector comprising reflecting walls 33 for reflecting toward a central axis AA' light rays 11 diverging from the active region 10.

In the preferred embodiment the multifaceted reflector comprises a series of integral concentric rings 31, each ring characterized by a region 32 of thickness which gradually increases with increasing radius followed by an abrupt decrease in thickness forming a reflecting wall 33. The rate of decrease in thickness forming wall 33 should be at least three times the rate of increase forming region 32. In typical application, the axis AA', through the center of region 10 to the common center of the reflecting rings, will coincide with the axis of an abutting optical fiber 40. With this arrangement, light rays 11 from active region 10, which in the absence of the reflector arrangement would be trapped within the semiconductor by total internal reflection, will instead be reflected by walls 33 onto sloped surfaces 32 at less than the critical angle and thus escape the semiconductor. Moreover, as illustrated, rays which would normally miss the core 41 of abutted optical fiber 40 will be reflected by walls 33 into the core. Advantageously the central region of the reflecting structure is provided with an integral lens 34.

Figure 2:
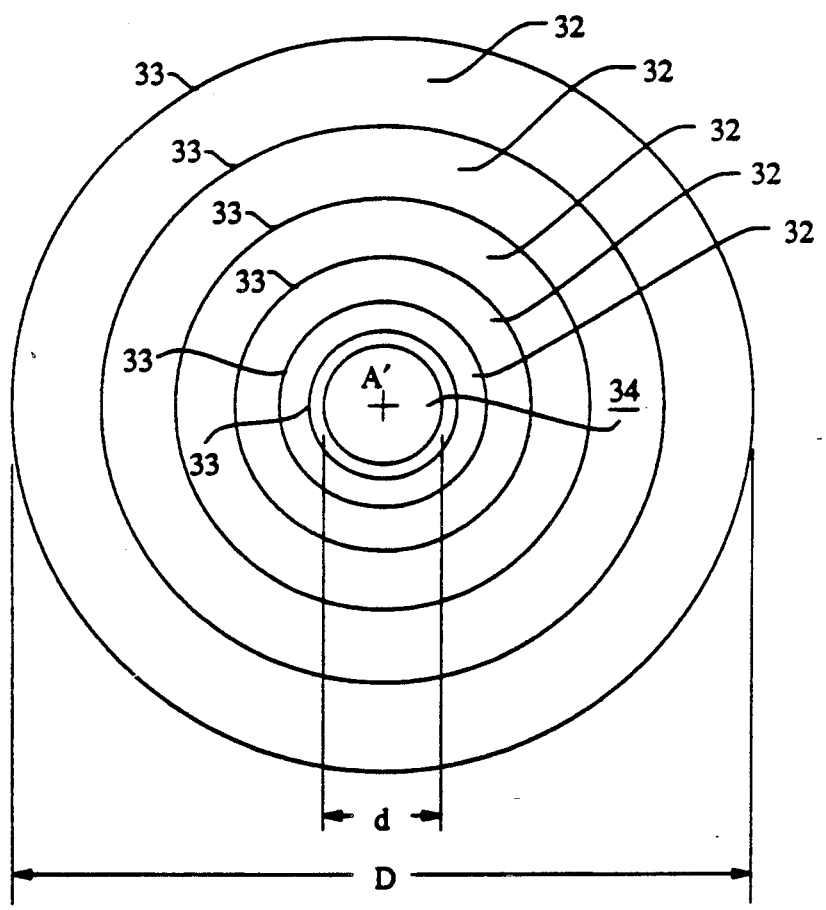
FIG. 2 is a schematic top view of the LED of FIG. 1.

FIG. 2 provides a top view of the preferred reflector. The reflector structure is centered opposite the center of LED active region 10 (not shown in FIG. 2) with the line between the respective centers defining the central axis AA'. The outer diameter D of an exemplary structure is 16 mils. The integral lens 34 preferably has a diameter d of about 2.1 mils, and plural reflector rings each comprising a region 32 of gradual slope and a reflecting wall 33 are concentrically disposed between the lens outer diameter d and the structure outer diameter D. The radial extent of the respective rings is preferably proportional to the distance of the ring from the central axis intercept A', and the maximum depth of etching (at walls 33) is preferably about 10 micrometers.

Referring back to FIG. 1, LED active region 10 can be of conventional structure. Advantageously the LED is a 1.3 micrometer InGaAsP LED. The substrate 20 is preferably a 5 mil InP substrate and includes an n-InP buffer layer 23 having a thickness of 2-5 micrometers and a doping of Sn to about $2 \times 10^{18}$ cm$^{-3}$. The active layer 10 is InGaAsP having a thickness of 0.5 to 1.5 micrometers and n-type doping of about $5 \times 10^{17}$ cm$^{-3}$. Covering the active layer is a confining layer 24 comprising p-InP having a thickness of 1-2 micrometers and doped with Zn or Cd to a concentration of $0.5-5 \times 10^{18}$ cm$^{-3}$. A cap layer 25 of InGaAsP is provided to reduce contact resistance. The cap layer can be 0.5 micrometers thick and be doped with Zn to about $1 \times 10^{19}$ cm$^{-3}$. Contact layer 27 is advantageously thermally coupled to the LED via dielectric layer 26 so that layer 27 also acts as a heat sink.

The LED of FIG. 1 is preferably fabricated by first forming the LED active region 10 on one side 21 of transparent substrate 20 and then forming the reflector structure comprised of rings 31 on the opposite side 22. The LED active region 10, as described above, is formed in a conventional manner. Upper contacts 26 and a heat sink layer 27 can be plated onto the device in accordance with techniques well known in the art. Optical fiber 40 can be bonded in place with transparent epoxy 42.

The reflector structure containing concentric surfaces 32 and 33 of different slopes, is preferably formed in a single photolithographic step in accordance with the method described in the co-pending application of G. E. Blonder filed concurrently herewith and entitled "Method for Forming a Sloped Surface Having a Predetermined Slope". In essence, the sloped surfaces are formed by applying a positive working photoresist to the substrate, exposing the resist to an amount of light in inverse proportion to the amount of substrate material to be removed, developing the resist to form a mask, and reactively ion etching the thus-masked structure. The goal of the process is to make steep reflecting walls 33 to reflect toward the axis AA' light diverging from the center of region 10.

The preferred fabrication process can be understood by reference to FIGS. 3 and 4 which photographically depict a preferred exposure mask used with a positive-working resist for forming the reflecting structure. FIG. 3 shows the central portion of the mask, and FIG. 4 shows an enlarged portion of the mask. In essence, the mask comprises a sequence of concentric rings ($R_i$), each ring comprised of opaque, congruent isosceles triangles 60 (of FIG. 4) whose bases join in a circle 62 about the common center A' (of FIG. 3). For forming the reflector rings, the apices 63 of the triangles point radially in. For forming the lens, the apices 63 point radially out. A small open area 64 radially extends between successive rings. The dimensions of a single triangle 60 are on the order of 2.5 micrometers for the base and 27 micrometers for the altitude. Such a mask can be readily fabricated using electron beam pattern generation equipment such as a MEBES Pattern Generator marketed by Perkin-Elmer Corporation.

In the photolithographic exposure step, the mask of FIG. 3 produces successive elemental rings of gradually decreasing exposure as the radial distance progresses from a region of maximal exposure in the space 64 between successive rings, through a region of linearly decreasing light as the radial distance moves from the apices 63 to the bases, to a region of minimal exposure in the region 62 of connecting bases. In use, the intensity of light reaching the underlying photoresist at a given radial distance r tends to the average intensity passing through the mask at that radial distance r. The result is maximal exposed resist in the open regions 64 linearly decreasing exposed resist moving from the apices to the bases, and minimal exposed resist underlying the base ring 62. The open region 64 thus defines the location of the reflecting wall 33 and the apex-to-base regions define the gradual slope regions 32.

For forming the lens region 34 the direction of the apices 63 is reversed so that the apices point radially outward. This provides a gradually increasing amount of exposed photoresist as the radial distance moves radially outward to the periphery of the lens 34.

After exposure, the resist is developed and baked. The resist forms an intaglio pattern on the workpiece. Since it is a positive resist, the greater the exposure, the greater the amount of resist removed by development. The resulting structure is placed in a reactive ion etcher, and the etching process produces on the substrate surface an intaglio pattern corresponding to that formed by development of the resist.

As a specific example, an LED on a 5 mil indium phosphide substrate was provided with a multifaceted reflector structure of the type shown in FIG. 1 by spinning onto the back of the substrate four micrometers of AZ 1400-31 photoresist and exposing through a 5× reduction mask depicted in FIG. 3. The exposure was for two seconds to a mercury arc lamp in a GCA stepper, Model MANN 4800. The exposed resist was developed for 30 seconds in Shipley 505 Developer and baked at 90° C. for 30 minutes.

The resulting structure was placed in a Plasma Technologies Plasmalab reactive ion etcher with anodized aluminum electrodes. The bottom electrode was maintained at a temperature of 70° C. and was completely covered by a quartz plate thermally bonded to it. After plasma cleaning the chamber with $O_2$, the structure was thermally bonded to the quartz plate by a thin film of diffusion pump fluid. The etcher was then evacuated to $10^{-5}$ Torr and plasma gases consisting of $SiCl_4$ at 10 sccm, $H_2$ at 10 sccm, and $CH_4$ at 1 sccm were flowed through at a total pressure of $1.5 \times 10^{-2}$ Torr. RF power at 13.6 MHz was applied at 180 watts for 60 minutes, giving 300 volts d.c. self-bias.

The result was an LED with an integral reflecting structure of concentric rings. Experiments showed that the LED with the reflecting structure coupled into an abutting optical fiber an amount of light about 5 times that coupled from a nonconfigured LED.

The advantages of the inventive structure are manifold. First, there is enhanced efficiency in the emission of light from the semiconductor. Light which would be totally internally reflected from a planar surface instead hits walls 33 and is reflected through sloped surface 32 out of the semiconductor. Second, there is enhanced efficiency in the coupling of the emitted light into the optical fiber. The walls not only reflect light out of the semiconductor, but they also direct it towards the fiber. The net result is the availability of additional light. The invention can thus be used to either increase the amount of light to the fiber 40 or, in the alternative, to permit relaxation of positional tolerance between the fiber 40 and LED 20, and thus reduce the cost of fabrication.

The invention, in its broader aspect, is thus an optical device for applying light to an optical guiding means. In essence, it comprises: a) a light source on a first surface of a transparent substrate for emitting light passing through the substrate to a second surface thereof; b) an optical guiding means disposed adjacent the second surface for receiving and guiding incident light, and c) a light reflecting structure comprising a plurality of reflecting walls disposed on the second surface between the source and the optical guiding means for reflecting to the guiding means light diverging from the source. The reflecting structure can be integrally formed on the second surface of the substrate. In the particular embodiment disclosed herein, the optical device comprises a light emitting diode with light source comprising the optically active region of the diode. The optical guiding means is an optical waveguide such as an optical fiber. The light reflecting structure preferably comprises a plurality of concentric rings about a common center, each ring comprising a first region of increasing thickness with radially increasing distance from the common center followed by a second region of decreasing thickness with increased radial distance forming a reflecting wall. The rate of decrease in the second region is at least three times the rate of increase in the first region.

In a more specific aspect, the invention comprises a light emitting diode adapted for coupling light into an adjacent optical waveguide comprising: a) a light emitting diode having an optically active region formed on a first surface of a transparent substrate, for emitting light passing through the substrate to a second surface thereof; and b) a light reflecting structure on the second surface of the substrate for receiving light diverging from the optically active region and reflecting the light toward the central region. The reflecting structure can be integrally formed on the second surface of the substrate. In preferred form, the reflecting structure comprises a plurality of concentric rings, as previously described, and advantageously a lens is disposed in the common central region of the rings.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. An optical device for applying light to an optical guiding means comprising:
    a light source on a first surface of a transparent substrate for emitting light passing through said substrate to a second surface thereof;
    an optical guiding means disposed adjacent said second surface for receiving and guiding incident light, and
    a light reflecting structure comprising a plurality of reflecting walls disposed on said second surface between said light source and said optical guiding means for reflecting to said optical guiding means light diverging from said source, said reflecting walls forming a plurality of concentric rings about a common center, each ring comprising a first region of increasing thickness with radially increasing distance from said common center followed by a second region of decreasing thickness with increasing radial distance, the rate of decrease in said second region being at least three times the rate of increase in said first region.

2. The optical device of claim 1 wherein said light reflecting structure is integrally formed on said second surface of said substrate.

3. The optical device of claim 2 wherein said optical device comprises a light emitting diode and said light source is the optically active region of said light emitting diode.

4. The optical device of claim 2 wherein said optical guiding means is an optical waveguide.

5. The optical device of claim 4 wherein said optical waveguide is an optical fiber.

6. A light emitting diode adapted for coupling light into an adjacent optical waveguide means comprising:
    a light emitting diode having an optically active region formed on a first surface of a transparent substrate for emitting light passing through said substrate to a second surface thereof;
    a light reflecting structure comprising a plurality of reflecting walls on said second surface of said substrate, said reflecting walls forming a plurality of concentric rings having a common center, each ring comprising a first region of increasing thickness with radially increasing distance from said common center followed by a region of reduced thickness for receiving light diverging from said optically active region and reflecting said light toward said common center.

7. A light emitting diode according to claim 6 wherein said light reflecting structure is integrally formed on said second surface of said substrate.

8. A light emitting diode according to claim 7 wherein said light reflecting structure further comprises concentric lens means radially inward of said concentric rings.

9. A light emitting diode according to claim 1 wherein said transparent substrate is indium phosphide.

10. A light emitting diode according to claim 1 comprising an InGaAs light emitting diode on an InP substrate.

* * * * *